(12) United States Patent
Jeong et al.

(10) Patent No.: US 12,733,112 B2
(45) Date of Patent: Sep. 8, 2026

(54) CIRCUIT BOARD AND MANUFACTURING METHOD THEREOF

(71) Applicant: SAMSUNG ELECTRO-MECHANICS CO., LTD., Suwon-si (KR)

(72) Inventors: Sangho Jeong, Suwon-si (KR); Yongduk Lee, Suwon-si (KR); Kihwan Kim, Suwon-si (KR); Changhwa Park, Suwon-si (KR); Hyun Hu Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 252 days.

(21) Appl. No.: 18/231,936

(22) Filed: Aug. 9, 2023

(65) Prior Publication Data

US 2024/0284605 A1 Aug. 22, 2024

(30) Foreign Application Priority Data

Feb. 20, 2023 (KR) ........................ 10-2023-0022143

(51) Int. Cl.
*H05K 3/46* (2006.01)
*H05K 1/02* (2006.01)
*H05K 3/00* (2006.01)

(52) U.S. Cl.
CPC ......... *H05K 3/4682* (2013.01); *H05K 1/0284* (2013.01); *H05K 3/0097* (2013.01)

(58) Field of Classification Search
CPC .. H05K 3/4682; H05K 1/0284; H05K 3/0097; H05K 3/4007; H05K 3/10; H05K 1/0296; H05K 1/115; H05K 3/007
USPC .......................................................... 174/262
See application file for complete search history.

(56) References Cited

U.S. PATENT DOCUMENTS 5,828,555 A * 10/1998 Itoh ..................... H05K 1/0221 439/74
9,630,832 B2 * 4/2017 Lin ......................... B81B 7/007
9,806,049 B2 * 10/2017 Yajima .................... H01L 24/05
2011/0000083 A1 1/2011 An et al.
2015/0175406 A1 6/2015 Lin et al.
2017/0092609 A1 3/2017 Yajima

FOREIGN PATENT DOCUMENTS

KR 10-2011-0003093 A 1/2011
KR 10-2014-0082442 A 7/2014

OTHER PUBLICATIONS

Office Action dated Apr. 20, 2026 in corresponding Korean Patent Application No. 10-2023-0022143 with English abstract.

* cited by examiner

*Primary Examiner* — Timothy J Thompson
(74) *Attorney, Agent, or Firm* — Morgan, Lewis & Bockius LLP

(57) ABSTRACT

A disclosed circuit board may include: a first insulation layer, a conductive layer disposed on the first insulating layer; a first via layer disposed in the first insulating layer to be connected to the conductive layer; and a first wire layer disposed under the first insulating layer and connected to the first via layer, and a trench extending from the conductive layer to at least a portion of the first insulating layer may be disposed.

13 Claims, 14 Drawing Sheets

CIRCUIT BOARD AND MANUFACTURING METHOD THEREOF

RELATED APPLICATIONS

This application claims priority to and the benefit of Korean Patent Application No. 10-2023-0022143, filed in the Korean Intellectual Property Office on Feb. 20, 2023, the entire contents of which are incorporated herein by reference.

TECHNICAL FIELD

The present disclosure relates to a circuit board and a manufacturing method thereof.

BACKGROUND OF THE DISCLOSURE

In recent years, IC bump pitch continues to shrink for the implementation of high-performance central processing units (CPUs), and in order to form protruding bumps, a process of nickel (Ni) plating and etching of an Ajinomoto Build-up Film (ABF) is applied. However, in this bump formation process, as galvanic corrosion occurs, a bump size cannot be secured, and defects due to crevices are likely to occur.

The above information disclosed in this Background section is only for enhancement of understanding of the background of the disclosure, and therefore, it may contain information that does not form the prior art that is already known in this country to a person of ordinary skill in the art.

SUMMARY OF THE DISCLOSURE

An aspect of the embodiments provides a circuit board and a manufacturing method of the same, capable of preventing galvanic corrosion to secure a bump size and preventing crevices caused by etching an Ajinomoto Build-up Film (ABF).

However, the problem to be solved by the embodiments is not limited to the above-described problem, and can be variously extended within the scope of the technical spirit included in the embodiments.

An embodiment provides a circuit board including: a first insulation layer; a conductive layer disposed on the first insulating layer; a first via layer disposed in the first insulating layer to be connected to the conductive layer; and a first wire layer disposed under the first insulating layer and connected to the first via layer, and a trench extending from the conductive layer to at least a portion of the first insulating layer may be disposed.

The conductive layer, a portion of the first insulating layer corresponding to the trench in a direction parallel to a surface of the first insulating layer, and a portion of the first via layer corresponding to the trench in the direction parallel to the surface of the first insulating layer may constitute a bump layer.

A plurality of trenches may be disposed, and the trenches may be disposed between portions of the bump layer or disposed at an edge of the circuit board.

A plurality of trenches may be disposed, and the trenches may be disposed between portions of the bump layer and disposed at an edge of the circuit board.

The trench may include a first portion disposed in the first insulating layer, and a second portion disposed in the conductive layer. The second portion may be extended from the first portion.

The trench may have a constant width measured in a planar direction of the circuit board.

The trench may be disposed at a portion of the first insulating layer along a height direction, which is a direction perpendicular to a surface of the first insulating layer.

It may further include: a second insulation layer disposed below the first insulation layer and the first wire layer; a second via layer disposed in the second insulating layer; and a second wire layer disposed under the second insulating layer.

It may further include a solder resist layer disposed under the second insulating layer to have an opening exposing a portion of the second wire layer.

The first via layer may be tapered in a direction from the first insulation layer to the conductive layer.

An embodiment provides a manufacturing method of a circuit board, including: forming a plurality of barrier portions spaced apart from each other on a carrier substrate; forming a conductive layer on the carrier substrate to expose upper portions of the barrier portions based on a height direction, which is a direction perpendicular to a surface of the carrier substrate; forming a first insulating layer on the conductive layer; separating the carrier substrate from the barrier portions and the conductive layer; and peeling the barrier portions.

The forming of the first insulating layer may include forming the first insulating layer to bury the exposed barrier portions.

It may further include forming a first via extending through the first insulating layer; forming a first via layer within the first via; and forming a first wire layer connected to the first via layer on the first insulating layer.

The barrier portions may include a dry film.

It may further include: forming a second insulating layer on the first insulating layer to embed the first wire layer; forming a second via to extend through the second insulating layer; forming a second via layer within the second via to be connected to the first wire layer; and forming a second wire layer connected to the second via layer.

It may further include, on the second insulating layer and the second wire layer, forming a third insulating layer on the second insulating layer to embed the second wire layer, forming a third via to extend through the third insulating layer, forming a third via layer within the third via to be connected to the second wire layer, and forming a third wire layer connected to the third via layer.

It may further include forming a solder resist layer on the second insulating layer to have an opening exposing a portion of the second wire layer.

In accordance with a circuit board and a manufacturing method according to an embodiment, it is possible to stably secure a bump size and prevent crevices by replacing a process of forming a plating layer on a carrier substrate with a process of etching an insulating material.

However, it is obvious that the effect of the embodiments is not limited to the above-described effect, and may be variously extended without departing from the spirit and scope of the embodiments.

DETAILED DESCRIPTION

Figure 1A:
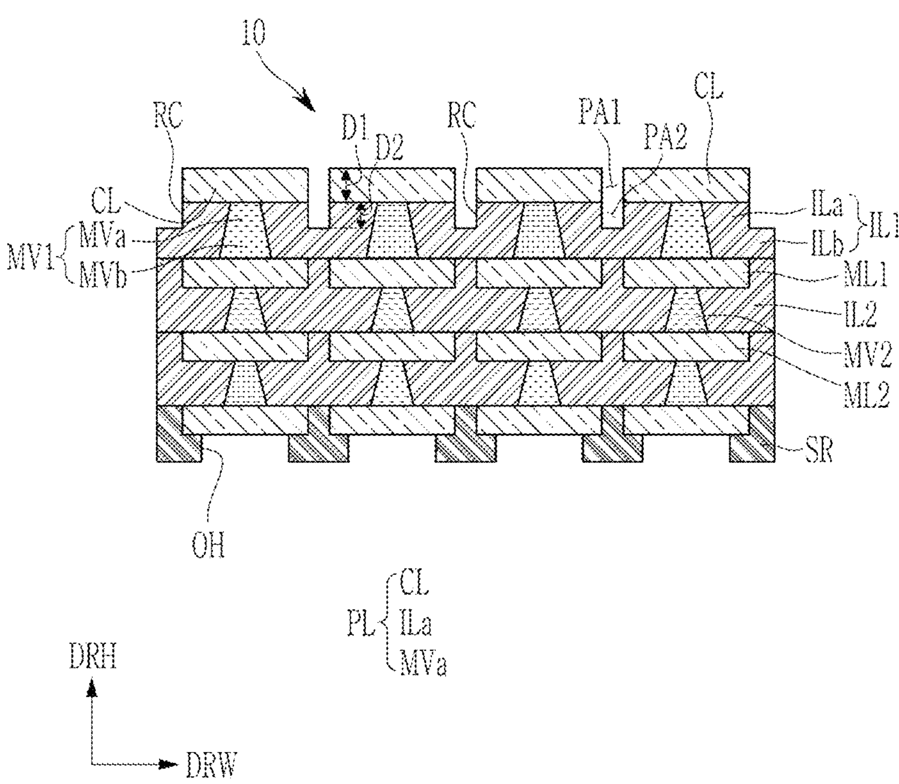
FIGS. 1A and 1B respectively illustrate a cross-sectional view and a part of a plan view of a circuit board according to an embodiment.

Hereinafter, various embodiment of the present disclosure will be described in detail so that a person of ordinary skill in the technical field to which the present disclosure belongs can easily implement it with reference to the accompanying drawings. As those skilled in the art would realize, the described embodiments may be modified in various different ways, all without departing from the spirit or scope of the present disclosure.

To clearly describe the present disclosure, parts that are irrelevant to the description in the drawings are omitted, and like numerals refer to like or similar constituent elements throughout the specification.

Further, since sizes and thicknesses of constituent members shown in the accompanying drawings are arbitrarily given for better understanding and ease of description, the present disclosure is not limited to the illustrated sizes and thicknesses. In the drawings, the size and thickness of layers, films, panels, regions, etc., are exaggerated for clarity. In the drawings, for better understanding and ease of description, the thicknesses of some layers and areas are exaggerated.

The accompanying drawings are provided only in order to allow embodiments disclosed in the present specification to be easily understood and are not to be interpreted as limiting the spirit disclosed in the present specification, and it is to be understood that the present disclosure includes all modifications, equivalents, and substitutions without departing from the scope and spirit of the present disclosure.

Terms including ordinal numbers such as first, second, and the like will be used only to describe various components, and are not to be interpreted as limiting these components. The terms are only used to differentiate one component from other components.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be further understood that terms "comprises/includes" or "have" used throughout the specification specify the presence of stated features, numerals, steps, operations, components, parts, or a combination thereof, but do not preclude the presence or addition of one or more other features, numerals, steps, operations, components, parts, or a combination thereof. Accordingly, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

In addition, throughout the specification, "connected" means that two or more components are not only directly connected, but two or more components may be connected indirectly through other components, physically connected as well as being electrically connected, or it may be referred to by different names depending on the location or function, but may mean integral.

Throughout the specification, the substrate may have a structure that is wide in a plan view and thin in a cross-sectional view,' the planar direction of the substrate' may indicate a direction parallel to the wide and flat surface of the substrate, and the 'thickness direction of the substrate' may indicate a direction that is perpendicular to a wide and flat surface of the substrate.

Hereinafter, various embodiments and variations will be described in detail with reference to drawings.

Figure 1B:
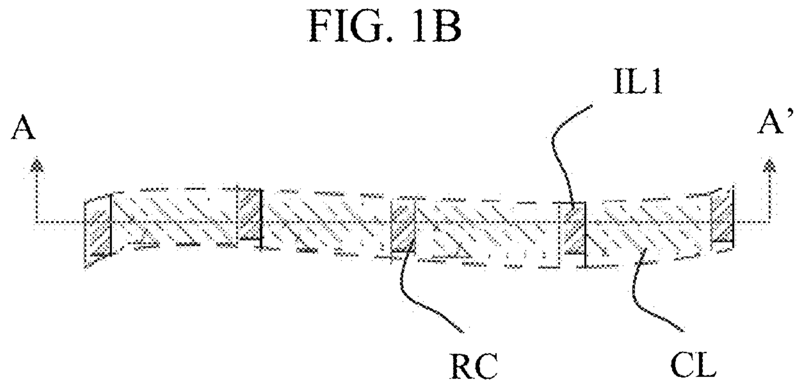

A circuit board according to an embodiment will now be described with reference to FIGS. 1A and 1B. FIGS. 1A and 1B respectively illustrate a cross-sectional view and a part of a plan view of a circuit board according to an embodiment. FIG. 1A is the cross-sectional view along line A-A' of FIG. 1B. A planar direction DRW described below indicates a direction parallel to a surface of a first insulating layer IL1, and a height direction DRH indicates a direction that is perpendicular to a surface of the first insulating layer IL1.

Referring to FIGS. 1A and 1B, a circuit board 10 according to the present embodiment may include the first insulating layer IL1, a first via layer MV1 disposed in the first insulating layer IL1, a first wire layer ML1 disposed under the first insulating layer IL1, a conductive layer CL disposed on the first insulating layer IL1, a trench RC disposed in a portion of the conductive layer CL and the first insulating layer IL1, a second insulating layer IL2 disposed under the first insulating layer IL1, a second via layer MV2 disposed in the second insulating layer IL2, a second wire layer ML2 disposed under the second insulating layer IL3, and a solder resist layer SR.

The first insulating layer IL1 may include a thermosetting resin such as an epoxy resin or polyimide, or a thermoplastic resin such as polyethylene (PE), polycarbonate (PC), or polyvinyl chloride (PVC). For example, the first insulating layer IL1 may include an Ajinomoto Build-up Film (ABF) or the like. The ABF may be a polymeric epoxy film that is available from Ajinomoto Fine-Techno Company, Inc. In addition, the first insulating layer IL1 may include a silica filler.

The conductive layer CL may be disposed on the first insulating layer IL1. The conductive layer CL may be connected to an external wire, and may exchange electrical signals of the circuit board with external electronic components (not illustrated). The conductive layer CL may include a conductive material such as copper (Cu), aluminum (Al), silver (Ag), tin (Sn), gold (Au), nickel (Ni), lead (Pb), titanium (Ti), or an alloy thereof.

The first wire layer ML1 may be disposed under the first insulating layer IL1, and may transfer an electrical signal. A metallic material may be used as a material of the first wire layer ML1. The metallic material may include a conductive material such as copper (Cu), aluminum (Al), silver (Ag), tin (Sn), gold (Au), nickel (Ni), lead (Pb), titanium (Ti), or an alloy thereof.

The first via layer MV1 may be disposed in a first via formed in the first insulating layer IL1. The first via may extend through the first insulation layer IL1. The first via layer MV1 formed in the first via may connect the conductive layer CL and the first wire layer ML1. The first via layer MV1 may include a conductive material such as copper (Cu), aluminum (Al), silver (Ag), tin (Sn), gold (Au), nickel (Ni), lead (Pb), titanium (Ti), or an alloy thereof. A side surface of the first via layer MV1 may be formed to be tapered. That is, the side surface of the first via layer MV1 may have an obtuse angle with respect to a plane parallel to a surface of the first insulating layer IL1.

The trench RC may be disposed in the conductive layer CL along the height direction DRH to extend through the conductive layer CL, and may be disposed on a portion of the first insulating layer IL1. Accordingly, a bottom surface of the trench RC may be higher than a bottom surface of the first insulating layer IL1.

The trench RC may have a rectangular shape with a cross-section parallel 5 to the height direction DRH of the substrate. That is, a width of the trench RC measured in the planar direction DRW of the substrate may be constant.

A surface of the conductive layer CL on which the trench RC is formed and a surface of the first insulating layer IL1 on which the trench RC is formed may have almost no roughness. That is, the surface of the conductive layer CL on which the trench RC is formed and the surface of the first insulation layer IL1 on which the trench RC is formed may be flat.

The trench RC may include a first portion PA1 disposed at a side of the conductive layer CL and a second portion PA2 disposed in the first insulation layer IL1. The second portion PA2 may be a portion extending from the first portion PA1. That is, the first portion PA1 and the second portion PA2 may be formed at once in one process.

The first insulating layer IL1 may include an insulating bump layer ILa disposed in a side surface of the trench RC and a lower bump insulating layer ILb disposed below the insulating bump layer ILa.

The first via layer MV1 may include a first partial via layer MVa disposed in the insulating bump layer ILa and connected to the conductive layer CL, and a second partial via layer MVb extending from the first partial via layer MVa and connected to the first wire layer ML1. The first partial via layer MVa may overlap the second portion PA2 of the trench RC disposed on a side surface of the first insulating layer IL1 along the planar direction DRW.

A bump layer PL may be disposed between the trenches RC. The bump layer PL may include the insulating bump layer ILa, the first partial via layer MVa, and the conductive layer CL. That is, the insulating bump layer ILa, which is a portion corresponding to the trench RC in the first insulating layer IL1 in the planar direction DRW, the first partial via layer MVa corresponding to the trench RC of the first via layer VA1 in the planar direction DRW, and the conductive layer CL may constitute the bump layer PL together. Accordingly, since a height of the bump layer PL is equal to a height of the trench RC, a height of the bump layer PL may be higher than a height D1 of the conductive layer CL by as much as a height D2 of the insulating bump layer ILa.

A plurality of trenches RC may be formed, and may be disposed between the bump layers PL, or may be disposed at an edge of the circuit board 10.

The second insulating layer IL2 may be disposed under the first insulating layer IL1. The second insulation layer IL2 may be formed such that the first wire layer ML1 is embedded. The second insulating layer IL2 may include a thermosetting resin such as an epoxy resin or polyimide, or a thermoplastic resin such as polyethylene (PE), polycarbonate (PC), or polyvinyl chloride (PVC). For example, the second insulating layer IL2 may include an Ajinomoto Build-up Film (ABF) or the like. In addition, the second insulating layer IL2 may include a silica filler.

The second via layer MV2 may be disposed in a second via formed in the second insulating layer. The second via may extend through the second insulation layer IL2, and the second via layer MV2 formed in the second via may be connected to the first wire layer ML1. The second via layer MV2 may include a conductive material such as copper (Cu), aluminum (Al), silver (Ag), tin (Sn), gold (Au), nickel (Ni), lead (Pb), titanium (Ti), or an alloy thereof. A side surface of the second via layer MV2 may be formed to be tapered. That is, the side surface of the second via layer MV2 may have an obtuse angle with respect to a plane parallel to a surface of the second insulating layer 110.

The second wire layer ML2 may be disposed under the second insulating layer IL2, and may be connected to the second via layer MV2 to transfer an electrical signal. A metallic material may be used as a material of the second wire layer ML2. The metallic material may include a conductive material such as copper (Cu), aluminum (Al), silver (Ag), tin (Sn), gold (Au), nickel (Ni), lead (Pb), titanium (Ti), or an alloy thereof.

In the embodiment, each of the second insulating layer IL2, the second via layer MV2, and the second wiring layer ML2 is illustrated as two layers, but the present disclosure is not limited thereto, and more layers than shown may be formed, or fewer layers may be formed. An outermost wire layer among the second wire layers ML2 may function as a pad for connection with another board or component.

A solder resist layer SR may be disposed under the second insulating layer IL2, and may cover the second wire layer ML2. The solder resist layer SR may have an opening OH exposing a portion of the second wire layer ML2. The solder resist layer SR may include an insulating material such as a solder resist.

A method of manufacturing a circuit board according to an embodiment will now be described with reference to FIG. 2 to FIG. 13 together with FIGS. 1A and 1B. FIG. 2 to FIG. 13 sequentially illustrate cross-sectional views showing a manufacturing method of a circuit board according to an embodiment.

Figure 2:
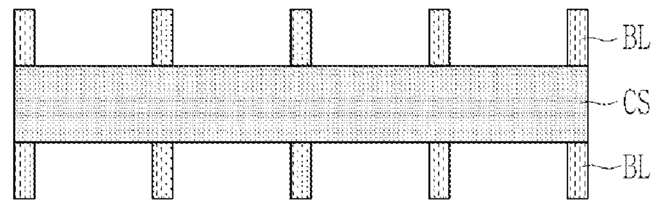
FIG. 2 to FIG. 13 illustrate cross-sectional views showing a manufacturing method of a circuit board according to an embodiment.
Figure 2:
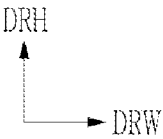

Referring to FIG. 2, first, a carrier substrate CS may be prepared. The carrier substrate CS may include a copper clad laminate. A plurality of barrier portions BL may be formed on the carrier substrate CS. The barrier portions BL may include a photosensitive material such as a dry film.

Figure 3:
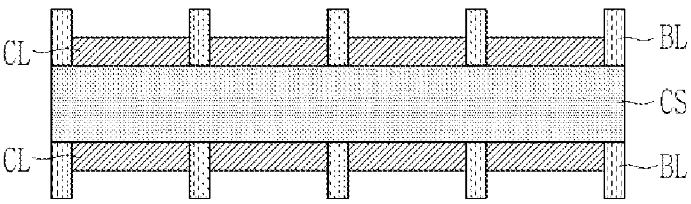
Figure 3:
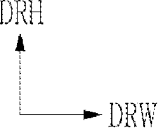

Referring to FIG. 3, the conductive layer CL may be disposed on the carrier substrate CS. The carrier substrate CS may be a substrate that can be separated from the conductive layer CL and the barrier portions BL in a subsequent process. The conductive layer CL may be stacked with a thickness sufficient to expose portions of the barrier portions BL. Specifically, the conductive layer CL may be stacked with a thickness that is sufficient to expose upper portions of the barrier portions BL in the height direction DRH, that is, in a direction perpendicular to the surface of the carrier substrate CS.

Figure 4:
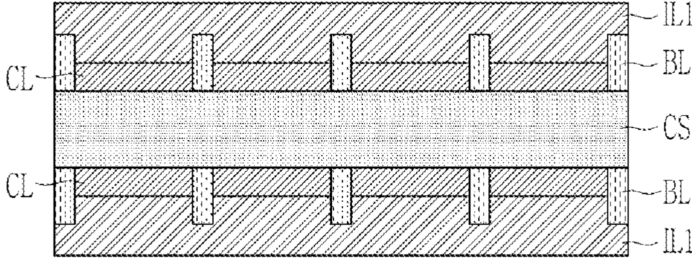
Figure 4:
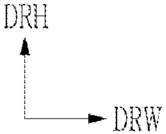

Referring to FIG. 4, the first insulating layer IL1 may be disposed on the conductive layer CL. The first insulation layer IL1 may be stacked such that the exposed barrier portions BL are buried.

Figure 5:
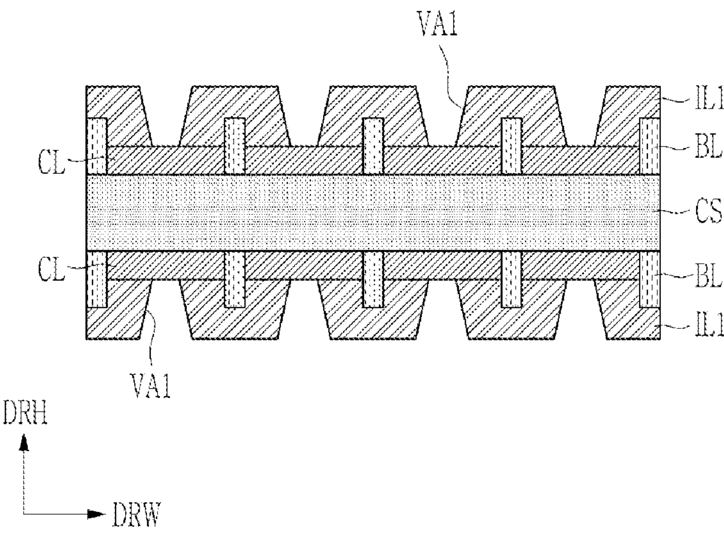

Referring to FIG. 5, the first via VA1 may be formed in the first insulating layer IL1. A photolithography process may be used to form the first via VA1. In this case, the first via VA1 may be formed to be tapered such that a direction in which it is stacked becomes wider.

Figure 6:
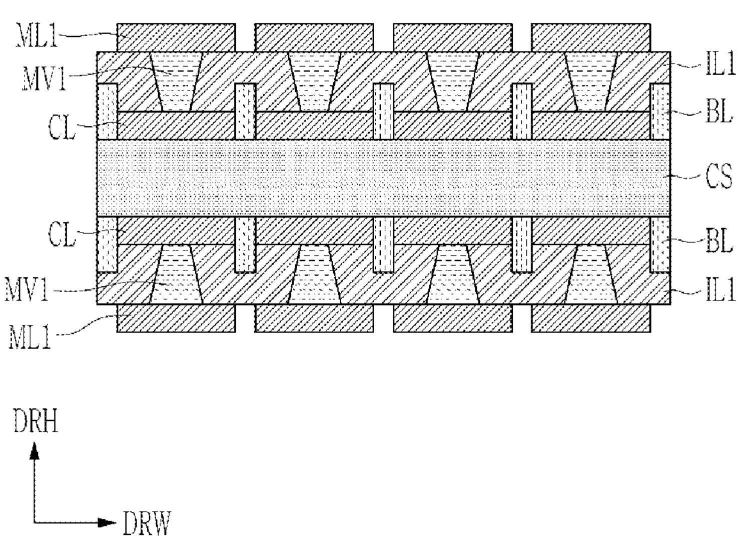

Referring to FIG. 6, the first via layer MV1 may be formed in the first via VA1, and the first wire layer ML1 connected to the first via layer MV1 may be disposed in the first insulating layer IL1.

Figure 7:
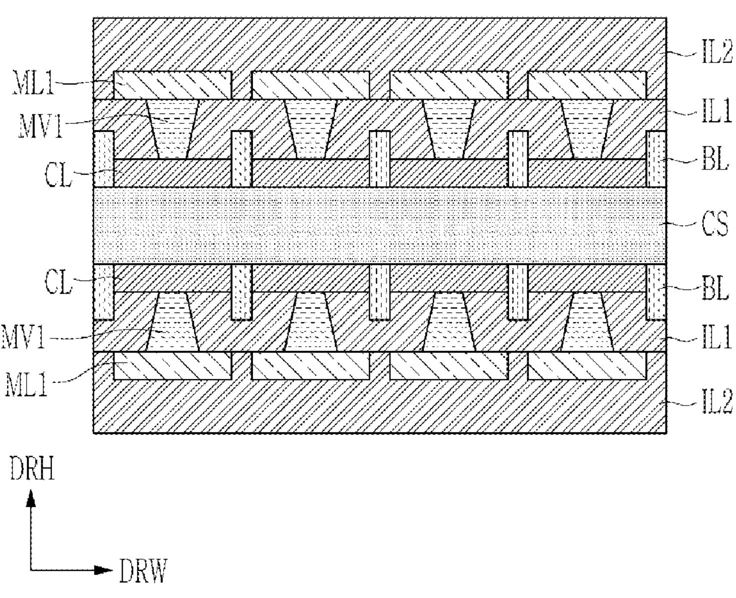

Referring to FIG. 7, the second insulating layer IL2 may be stacked on the first insulating layer IL1. The second insulating layer IL2 may be stacked such that the first wire layer ML1 is embedded.

Figure 8:
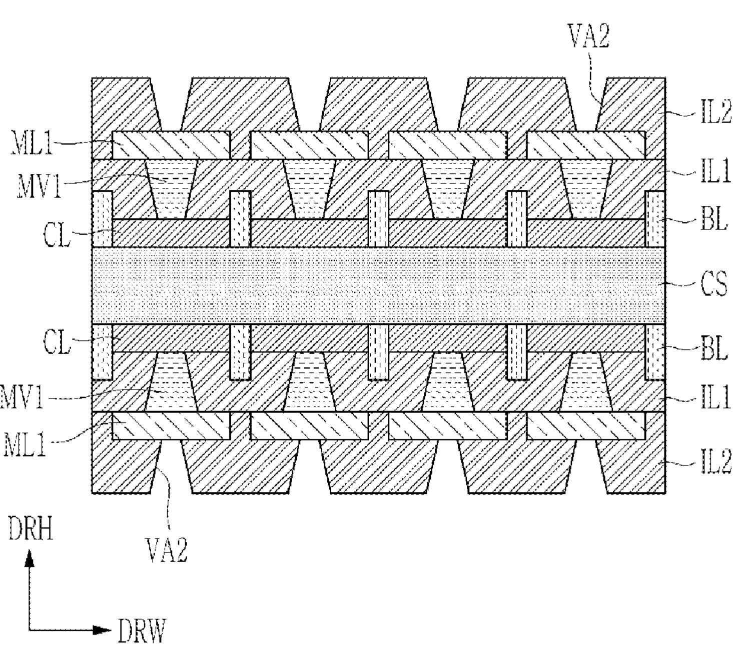

Referring to FIG. 8, the second via VA2 may be formed in the second insulating layer IL2. The second via VA2 may be formed to extend through the second insulation layer IL2.

Figure 9:
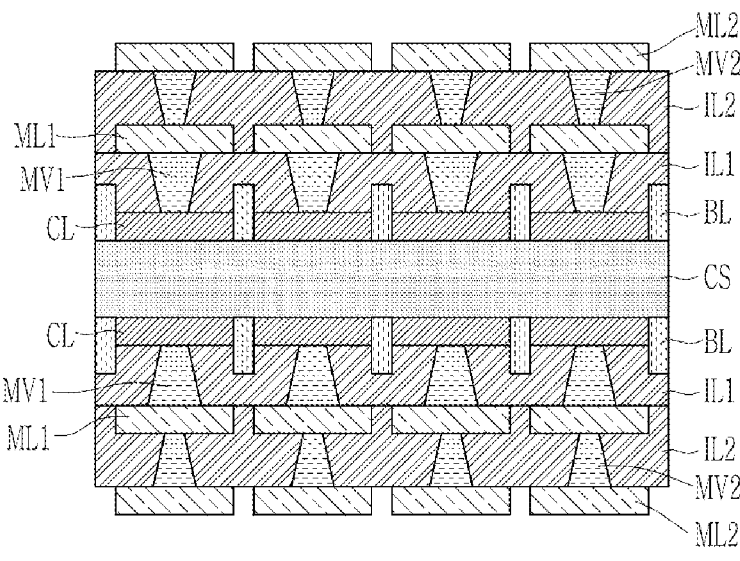
Figure 9:
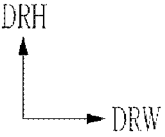

Referring to FIG. 9, the second via layer MV2 is formed in the second via VA2 in the second insulating layer IL2, and a second wire layer ML2 may be disposed on the second insulating layer IL2.

Figure 10:
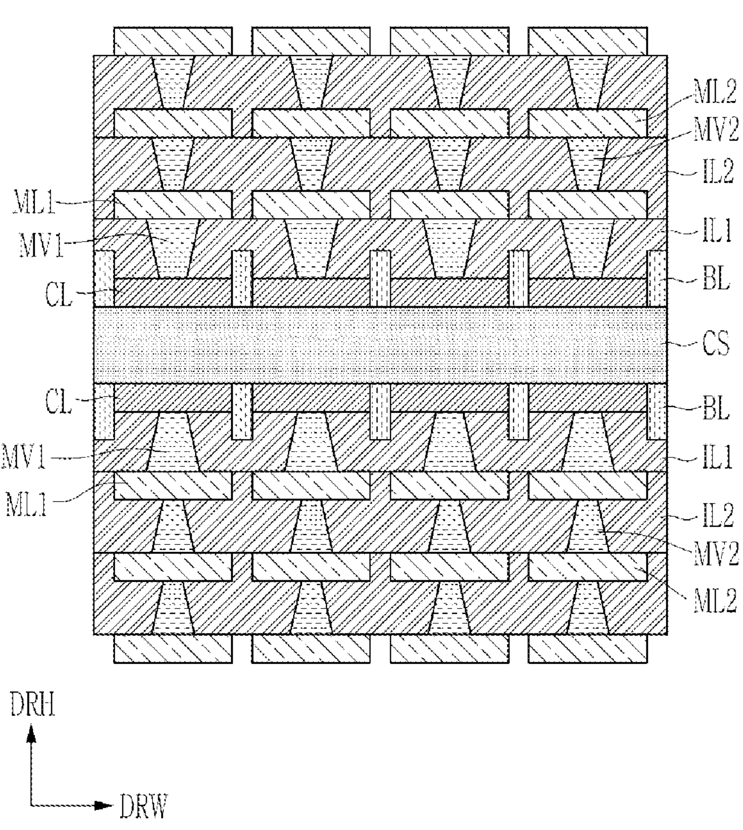

Referring to FIG. 10, forming the second via layer MV2 in the second via VA2 in the second insulating layer IL2 and forming the second wire layer ML2 on the second insulating layer IL2 may be repeated. In the present embodiment, although each of the second insulating layer IL2, the second via layer MV2, and the second wire layer ML2 are illustrated as two layers, the present disclosure is not necessarily limited thereto, and a greater or smaller number of second insulating layers IL2, second via layers MV2, and second wire layers ML2 than those shown may be formed.

Figure 11:
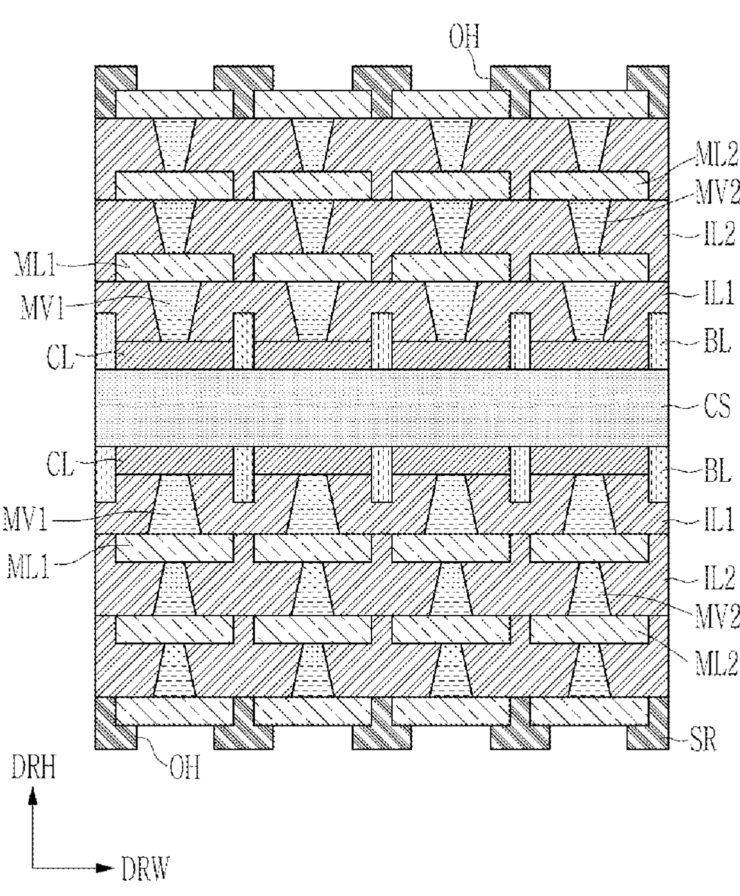

Referring to FIG. 11, a solder resist layer SR having an opening OH exposing a portion of the second wire layer ML2 may be disposed on the second insulating layer IL2. The opening OH may be formed by performing processes such as exposure, curing, and development on the solder resist layer SR using an etching mask.

Figure 12:
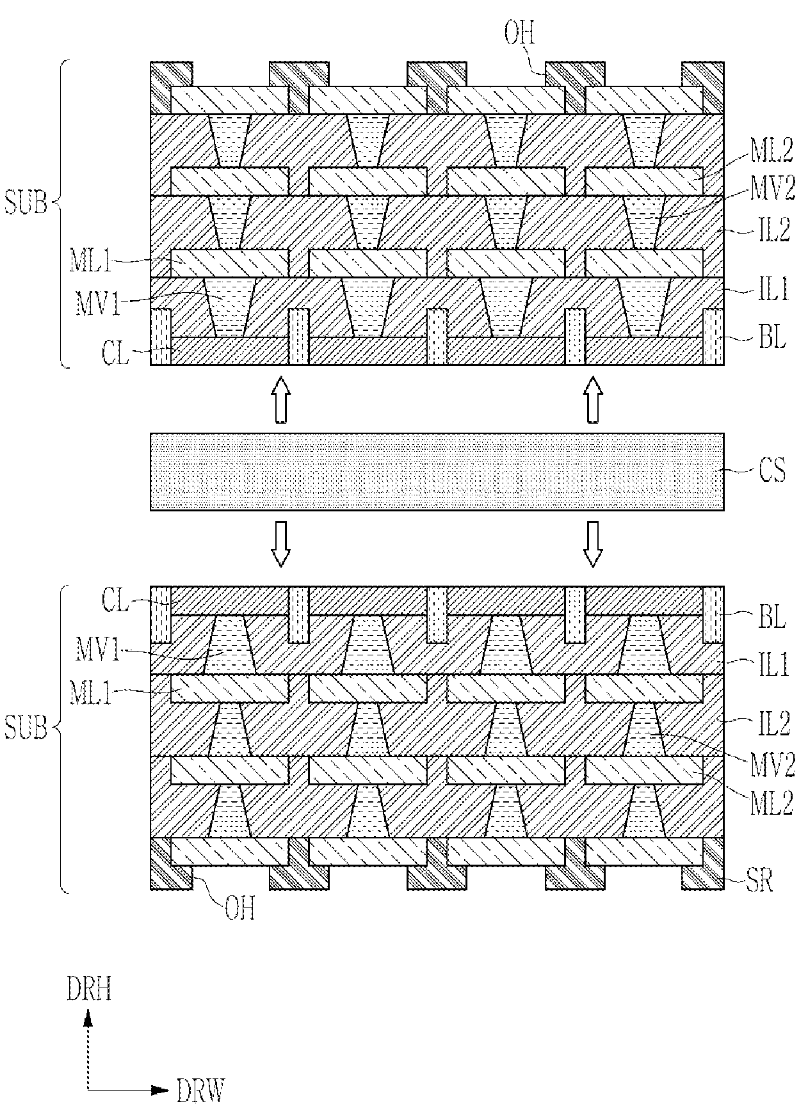

As illustrated in FIG. 12, the substrate SUB may be separated from opposite sides of the carrier substrate CS.

Figure 13:
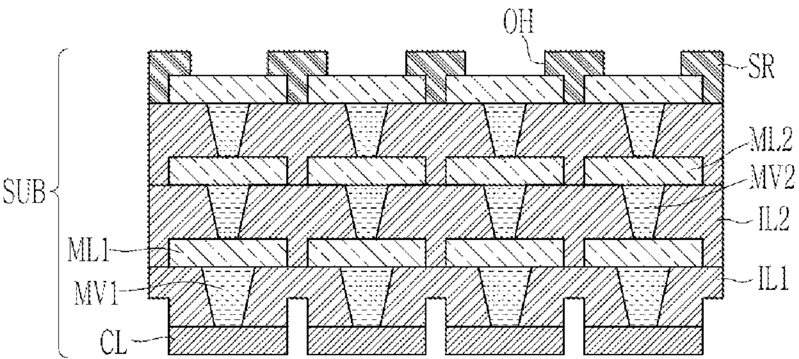
Figure 13:
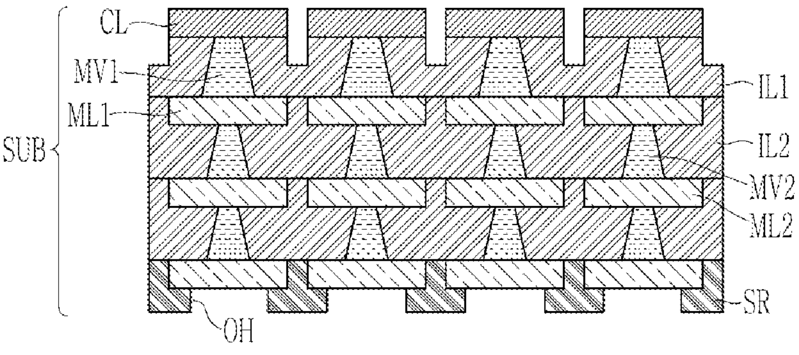
Figure 13:
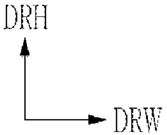

As illustrated in FIG. 13, the barrier portions BL may be peeled off from the substrate SUB. Trenches RC may be formed at positions where the plurality of barrier portions BL are separated.

In accordance with a manufacturing method of a circuit board according to the present embodiment, the barrier portions BL are first disposed on the carrier substrate CS, and the conductive layer CL is formed in a state where the plurality of barrier parts BL serve as shielding, and then the barrier portions BL are peeled off in a subsequent process. Accordingly, a plating process of Ni or the like formed on the carrier substrate CS may be omitted, and galvanic corrosion may be prevented, and the bump layer PL may be formed without going through a process of etching the insulating layer. As a result, crevices may be prevented from being generated, and roughness may be prevented from being formed on a wall surface of the bump layer PL. In addition, a portion of the first insulating layer IL1 may become the bump layer PL, and thus the thickness of the bump layer PL may be sufficiently secured even without forming the conductive layer CL thickly.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A circuit board comprising:
a first insulation layer;
a conductive layer disposed on an upper surface of the first insulating layer;
a first via layer disposed in the first insulating layer to be connected to the conductive layer; and
a first wire layer disposed under a lower surface of the first insulating layer and connected to the first via layer; and
a trench extending from the conductive layer through the upper surface of the first insulating layer to at least a portion of the first insulating layer and being spaced apart from the lower surface of the first insulating layer.

2. The circuit board of claim 1, wherein
the conductive layer, a portion of the first insulating layer corresponding to the trench in a direction parallel to a surface of the first insulating layer, and a portion of the first via layer corresponding to the trench in the direction parallel to the surface of the first insulating layer constitute a bump layer.

3. The circuit board of claim 2, wherein
a plurality of trenches are disposed, and
the trenches are disposed between portions of the bump layer or disposed at an edge of the circuit board.

4. The circuit board of claim 2, wherein
a plurality of trenches are disposed, and
the trenches are disposed between portions of the bump layer and disposed at an edge of the circuit board.

5. The circuit board of claim 1, wherein
the trench includes a first portion disposed in the first insulating layer, and a second portion disposed in the conductive layer,
wherein the second portion extends from the first portion.

6. The circuit board of claim 5, wherein
the trench has a constant width measured in a planar direction of the circuit board.

7. The circuit board of claim 1, wherein
the trench is disposed at a portion of the first insulating layer along a height direction, which is a direction perpendicular to a surface of the first insulating layer.

8. The circuit board of claim 1, further comprising:
a second insulation layer disposed below the first insulation layer and the first wire layer;
a second via layer disposed in the second insulating layer; and
a second wire layer disposed under the second insulating layer.

9. The circuit board of claim 8, further comprising
a solder resist layer disposed under the second insulating layer to have an opening exposing a portion of the second wire layer.

10. The circuit board of claim 1, wherein
the first via layer is tapered in a direction from the first insulation layer to the conductive layer.

11. A circuit board comprising:
a first insulation layer;
a conductive layer disposed on an upper surface of the first insulating layer;
a first via layer disposed in the first insulating layer to be connected to the conductive layer; and
a first wire layer disposed under a lower surface of the first insulating layer and connected to the first via layer; and
a trench extending from the conductive layer to at least a portion of the first insulating layer,
wherein the first via layer is tapered in a direction from the lower surface of the first insulating layer to the upper surface of the first insulating layer.

12. The circuit board of claim 11, wherein
the conductive layer, a portion of the first insulating layer corresponding to the trench in a direction parallel to a surface of the first insulating layer, and a portion of the first via layer corresponding to the trench in the direction parallel to the surface of the first insulating layer constitute a bump layer.

13. The circuit board of claim 12, wherein
a plurality of trenches are disposed, and the trenches are disposed between portions of the bump layer or disposed at an edge of the circuit board.

* * * * *